United States Patent
Schuster et al.

(10) Patent No.: US 8,471,561 B2
(45) Date of Patent: Jun. 25, 2013

(54) SAFEGUARD FOR UNSCREWING GRADIENT COIL CONNECTIONS

(75) Inventors: Johann Schuster, Oberasbach (DE); Stefan Stocker, Grossenseebach (DE)

(73) Assignee: Siemens Aktiengesellschaft, Munich (DE)

( * ) Notice: Subject to any disclaimer, the term of this patent is extended or adjusted under 35 U.S.C. 154(b) by 374 days.

(21) Appl. No.: 12/849,051

(22) Filed: Aug. 3, 2010

(65) Prior Publication Data

US 2011/0034054 A1   Feb. 10, 2011

(30) Foreign Application Priority Data

Aug. 5, 2009  (DE) .......................... 10 2009 036 182

(51) Int. Cl.
*G01R 33/20*   (2006.01)

(52) U.S. Cl.
USPC .......................................... 324/318; 324/321

(58) Field of Classification Search
USPC ............ 324/300–322; 600/407–435; 439/312
See application file for complete search history.

(56) References Cited

U.S. PATENT DOCUMENTS

2011/0034054 A1 *  2/2011  Schuster et al. .............. 439/312

FOREIGN PATENT DOCUMENTS

DE          3628854 A1 *  3/1988
DE   10 2006 000 927 A1    5/2007

* cited by examiner

*Primary Examiner* — Melissa Koval
*Assistant Examiner* — Tiffany Fetzner
(74) *Attorney, Agent, or Firm* — Schiff Hardin LLP

(57) ABSTRACT

A securing part and an unscrewing safeguard system of a gradient coil plug for an MRT that can be fixed to a gradient coil bushing include a gradient coil plug, a gradient coil bushing, a cap nut with a keyed surface and, to secure the gradient coil plug to the gradient coil bushing, a multi-tooth ring fixed to the plug so that the ring cannot rotate, and a securing part with a multi-tooth ring engagement contour that can be brought into engagement with the multi-tooth ring, and with a keyed surface engagement contour that can be brought into mating with the keyed surface of the ring.

9 Claims, 2 Drawing Sheets

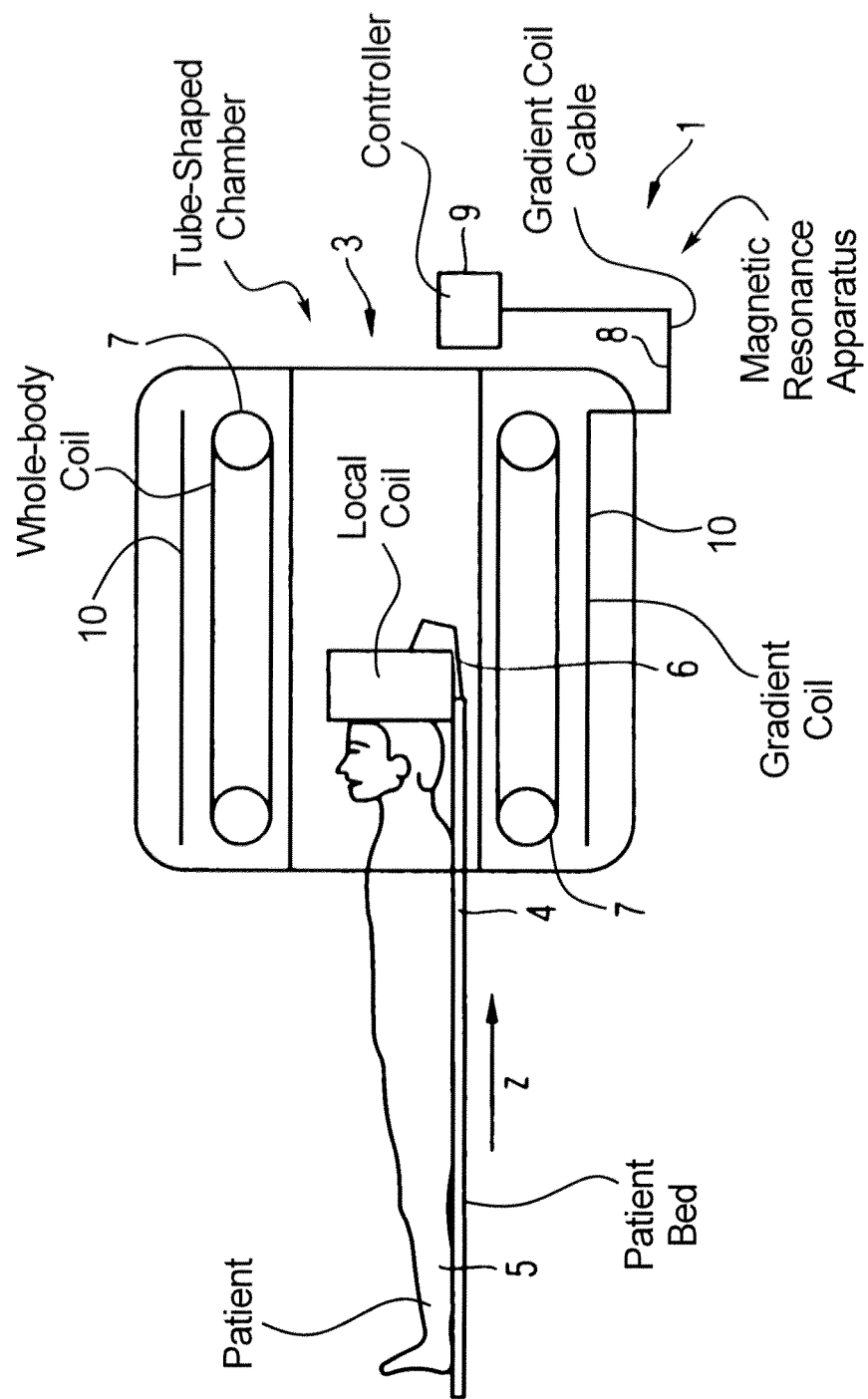

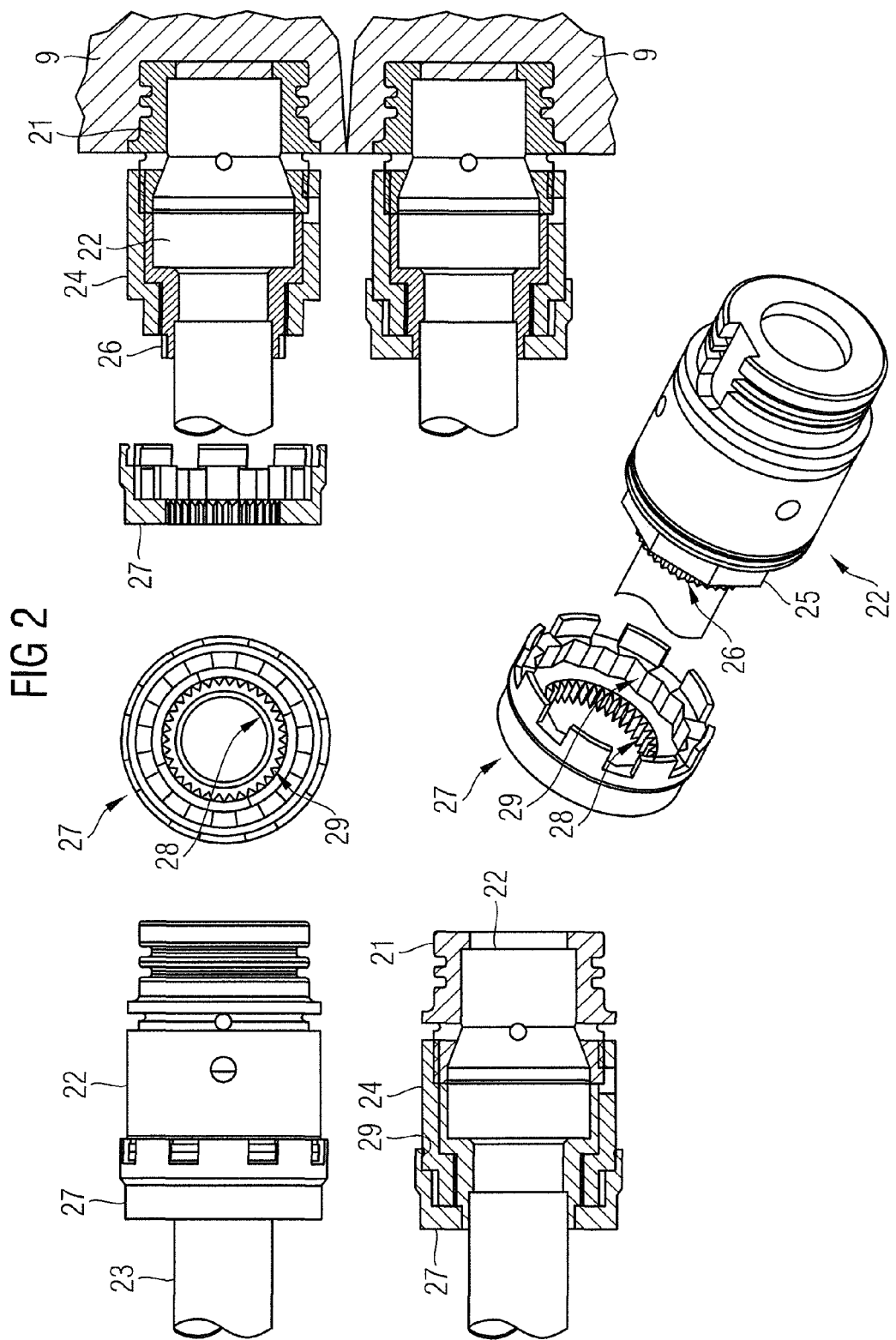

SAFEGUARD FOR UNSCREWING GRADIENT COIL CONNECTIONS

BACKGROUND OF THE INVENTION

1. Field of the Invention

The invention concerns an unscrewing safeguard for a gradient coil connection.

2. Description of the Prior Art

Magnetic resonance apparatuses, in particular for the examination of patients by magnetic resonance tomography (MR, MRT), are known from DE10314215B4, for example.

Modern magnetic resonance systems operate with coils that emit radio-frequency pulses to excite nuclear spins to magnetic resonance and/or to acquire the induced magnetic resonance signals. A magnetic resonance system typically has a permanent magnet or (more often) a superconducting coil to generate a basic magnetic field (B0) that is optimally homogeneous in an examination region. A large coil known as a whole-body coil (also called a body coil or BC) is normally permanently installed in the MR apparatus. Multiple local coils (also called surface coils or LCs) may also be provided. To obtain information from which images of a patient can be generated, selected regions of the subject or patient to be examined are read out with gradient coils for each of three axes (for example X, Y approximately radial to the patient, Z in the longitudinal direction of the patient). The spatial coding in magnetic resonance tomography is typically achieved using a gradient coil system with three independently controllable, magnetically orthogonal gradient field coils. The orientation of the coding plane ("gradient field") can be freely selected by superimposing the three freely scalable fields (in three directions X, Y, Z).

Conventionally, a coaxial gradient current connector is pulled through and secured to a gradient coil bushing by a cap nut with fine threading.

SUMMARY OF THE INVENTION

An object of the invention is to provide a connection for high gradient currents that can be detached in the event of service and that is difficult to detach by vibration or alternating Lorentz forces.

The above object is achieved in accordance with the invention by an unscrewing safeguard system for a plug that can be fixed to a bushing, the system including the plug, a bushing, a cap nut with a keyed surface that secures the plug to the bushing, a multi-tooth ring fixed to the plug so that the ring cannot rotate, and a securing part with a multi-tooth ring engagement contour that can be brought into engagement with the multi-tooth ring, and having a keyed surface engagement contour that can be brought into mating engagement with the keyed surface of the cap nut.

The invention is particularly suited for gradient coil plugs, but, the invention can also be used for other bushings and plugs.

The invention also concerns a securing part for a cap nut that can be positively fixed on a bushing and on a plug, the securing part having a multi-tooth ring engagement contour that can be brought into engagement with the multi-tooth ring, and a keyed surface engagement contour that can be brought into engagement with a correspondingly keyed surface.

The bushing is advantageously a gradient coil bushing and the plug is a gradient coil plug, but the invention can also be used for other bushings and plugs.

BRIEF DESCRIPTION OF THE DRAWINGS

FIG. 1 schematically illustrates a magnetic resonance apparatus.

FIG. 2, in multiple views, shows an embodiment according to the invention of an unscrewing safeguard for a gradient coil connection.

DESCRIPTION OF THE PREFERRED EMBODIMENTS

FIG. 1 shows a magnetic resonance apparatus 1 with a whole-body coil 7 and a tube-shaped chamber 3 into which a patient bed 4 (with, for example, a patient 5 and a local coil 6) can be driven in direction z in order to generate MRT exposures of the patient 5. A gradient coil 10 is connected to a controller 9 (shown very schematically and simply) via gradient coil cable 8, at the end of which is located a gradient coil plug that can be plugged into the gradient coil bushing at the side of the controller 9 and there can be secured with a cap nut that can in turn be secured with a securing part at the gradient coil plug and the gradient coil bushing, as is shown in FIG. 2.

FIG. 2 shows in multiple views an unscrewing safeguard system for a plug (here a gradient coil plug) for an MRT that can be fixed at a bushing (here a gradient coil bushing), which unscrewing safeguard system includes:
 a gradient coil bushing 21,
 a gradient coil plug 22 with a coaxial cable 23 attached to this,
 a cap nut 24 with a keyed surface 25 to secure the gradient coil plug 22,
 a multi-tooth ring 26 that is fixed at the gradient coil plug 22 such that it cannot rotate,
 a securing part 27 with a multi-tooth ring engagement contour (28) that can be brought into engagement with the multi-tooth ring 26, and having a keyed surface engagement contour 29 that can be brought into engagement with the keyed surface 25.

The device described herein with two positive-fit features prevents the cap nut 24 from unscrewing. The multi-tooth ring 28 is attached to the stationary coaxial tube 23 (which is fixed at the plug 22). This can be produced as single part (that is soldered on, for example) or by a contour shaped to the existing plug housing of the plug 22. A securing part 27 is positively placed over this multi-tooth ring 26 and this is secured against rotating relative to the coaxial tube 23 or the plug housing. The securing part 27 simultaneously engages the wrench surfaces 25 of the cap nut 24 in order to prevent a rotation between the multi-tooth ring 26 and the rotatable cap nut 24 after this has been tightened. Due to the finer (in comparison with the wrench surfaces) multi-tooth division of the multi-tooth ring 26, under consideration of the mechanical tolerances an engagement in various positions (rotated relative to one another around the longitudinal axis) at the six-edge (or eight-edge) division of the wrench surfaces 25 is possible. In order to prevent slippage of the securing part 27 from its securing position, it can be equipped with snap safeguards at the cap nut.

An advantage is the system represents a vibration-resistant unscrewing safeguard that can simply be released in the event of service.

Two rotation grids are connected with one another in order to enable an unscrewing safeguard for coaxial gradient connections. The problem of an undefined rotation position of the wrench surfaces (of the cap nut that can move at the fixed plug housing) relative to the plug housing after the tightening of the cap nut and the randomly adjusted rotation position of the wrench surfaces at the fixed plug housing is solved via a (fine) multi-tooth division. The securing part enables a fixing via the find multi-tooth locking device and the defined tolerances.

Although modifications and changes may be suggested by those skilled in the art, it is the intention of the inventor to embody within the patent warranted hereon all changes and modifications as reasonably and properly come within the scope of his contribution to the art.

We claim as our invention:

1. A gradient coil connection assembly comprising:
   a gradient coil terminating in a plug having a connection end;
   a gradient coil receptacle having a bushing having an internal configuration that receives said plug connection end;
   a cap nut on said plug that secures said plug to said bushing, said cap nut having a keyed surface;
   a multi-tooth ring non-rotatively fixed to said plug; and
   a securing part comprising a multi-tooth ring engagement contour configured to engage said multi-tooth ring, and having a keyed surface engagement contour that mates with said keyed surface of said cap nut.

2. A gradient coil connection assembly as claimed in claim 1 wherein each of said multi-tooth ring and said multi-tooth engagement contour comprises more than 16 teeth.

3. A gradient coil connection assembly as claimed in claim 1 wherein said plug has a central longitudinal access proceeding in a direction of engagement of said plug with said bushing, and wherein said securing part is rotatable through a plurality of positions relative to said multi-tooth ring, and wherein said multi-tooth ring and said multi-tooth engagement contour each comprise multiple teeth that, in combination, define one defined position of said securing part relative to said plug, among said plurality of positions.

4. A gradient coil connection assembly as claimed in claim 1 wherein said plug comprises a tube connected to said connection end, and, wherein said multi-tooth ring is non-displaceably mounted on said tube.

5. A gradient coil connection assembly as claimed in claim 4 wherein said multi-tooth ring is soldered on said tube.

6. A gradient coil connection assembly as claimed in claim 5 wherein said plug comprises a plug housing that includes said tube, and wherein said multi-tooth ring is molded as a part of said plug housing.

7. A gradient coil connection assembly as claimed in claim 1 wherein said securing part is force-fit on said multi-tooth ring.

8. A gradient coil connection assembly as claimed in claim 1 wherein said cap nut is rotatable to hold said connection end of said plug in said bushing, and wherein said securing part is force-fit on said multi-tooth ring, with said keyed surface of said cap nut and said keyed surface engagement contour in mating engagement to prevent rotation between said multi-tooth ring and said cap nut.

9. A gradient coil connection assembly as claimed in claim 1 wherein said plug comprises a plug housing, and wherein said securing part is placed on said multi-tooth ring with a force-fit that secures said securing part against rotation relative to said plug housing, with said keyed surface of said cap nut engaging the keyed surface engagement contour of said securing part to prevent rotation between said multi-tooth ring and said cap nut.

* * * * *